United States Patent
Chen et al.

(10) Patent No.: US 7,349,211 B2
(45) Date of Patent: Mar. 25, 2008

(54) MOUNTING APPARATUS FOR FAN

(75) Inventors: Yun-Lung Chen, Shenzhen (CN); Qing-Hao Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,689

(22) Filed: Apr. 21, 2006

(65) Prior Publication Data

US 2007/0171612 A1  Jul. 26, 2007

(30) Foreign Application Priority Data

Jan. 21, 2006  (CN) .................... 200620054299.X

(51) Int. Cl.
*H05K 7/20* (2006.01)
*H05K 5/00* (2006.01)
*F04D 29/64* (2006.01)

(52) U.S. Cl. .................... 361/695; 415/213.1; 454/184
(58) Field of Classification Search ................ 361/687, 361/690–695; 165/80.3; 312/236; 454/184; 415/213.1, 214.1; 24/453, 457–458, 625; 248/505, 510; 417/360, 423.15

See application file for complete search history.

(56) References Cited

U.S. PATENT DOCUMENTS

| | | | |
|---|---|---|---|
| 6,031,719 A * | 2/2000 | Schmitt et al. | 361/695 |
| 6,215,659 B1 | 4/2001 | Chen | |
| 6,478,284 B2 * | 11/2002 | Qiu | 248/680 |
| 6,579,062 B2 * | 6/2003 | Lu et al. | 415/213.1 |
| 6,749,398 B2 * | 6/2004 | Lu et al. | 415/121.2 |
| 6,805,626 B2 * | 10/2004 | Chen | 454/184 |
| 7,245,488 B2 * | 7/2007 | Chen | 361/695 |
| 2006/0056152 A1 * | 3/2006 | Li et al. | 361/697 |
| 2007/0146991 A1 * | 6/2007 | Chen et al. | 361/695 |

* cited by examiner

*Primary Examiner*—Jayprakash Gandhi
*Assistant Examiner*—Robert J Hoffberg
(74) *Attorney, Agent, or Firm*—Wei Te Chung

(57) ABSTRACT

A mounting apparatus for mounting a fan in a computer enclosure includes a panel configured to mount the fan thereon, and a plurality of restricting members. The panel defines a ventilation area corresponding to the fan for air ventilation between an inside and an outside of the computer enclosure. The plurality of restricting members is set around the ventilation area to restrict the movement of the fan along the panel. The plurality of restricting members includes a mounting bracket, which includes an elastic shank extending up from the panel and a pressing portion protruding from the shank configured to clamp the fan against the panel.

9 Claims, 4 Drawing Sheets

MOUNTING APPARATUS FOR FAN

FIELD OF THE INVENTION

The present invention relates to mounting apparatus for fans, and particularly to a mounting apparatus which can conveniently and firmly secure a fan to a computer enclosure.

DESCRIPTION OF RELATED ART

A typical contemporary personal computer includes a central processing unit (CPU) and a power supply. Heat generated by the CPU is removed away from the CPU by a fan attached to the CPU. There is usually a fan in the power supply to assist in cooling the power supply as well.

Components are being mounted in computer enclosures in greater numbers than ever before, and these components not only generate heat in the computer enclosures, but also block air flow, so fans are often installed in the computer enclosures to assist in cooling the computer enclosure. The fans are generally mounted in the computer enclosures by screws which require a screw driver. The attachment procedure is unduly tedious and inconvenient, especially when the enclosure is small. Furthermore, other components in the enclosure are prone to be accidentally damaged during the attachment procedure.

Another conventional means of attachment of a fan to a computer enclosure is to use a fan holder. The fan holder includes four lateral spring hooks and two longitudinal spring hooks. An enclosure defines four lateral and two longitudinal slots therein. The hooks respectively extend through the slots of the enclosure and engage therein. Thus, the fan is fastened to the enclosure. The fan holder does not require screws. However, the fan holder is not easily removed from the enclosure when maintenance or replacement is required.

What is needed, therefore, is an improved mounting apparatus for a fan which solves the above-mentioned problems.

SUMMARY OF INVENTION

A mounting apparatus for mounting a fan in a computer enclosure includes a panel configured to mount the fan thereon, and a plurality of restricting members. The panel defines a ventilation area corresponding to the fan for air ventilation between an inside and an outside of the computer enclosure. The plurality of restricting members is set around the ventilation area to restrict the movement of the fan along the panel. The plurality of restricting members includes a mounting bracket, which includes an elastic shank extending up from the panel and a pressing portion protruding from the shank configured to clamp the fan against the panel.

Other advantages and novel features will be drawn from the following detailed description of a preferred embodiment with attached drawings, in which:

DETAILED DESCRIPTION

Figure 1:
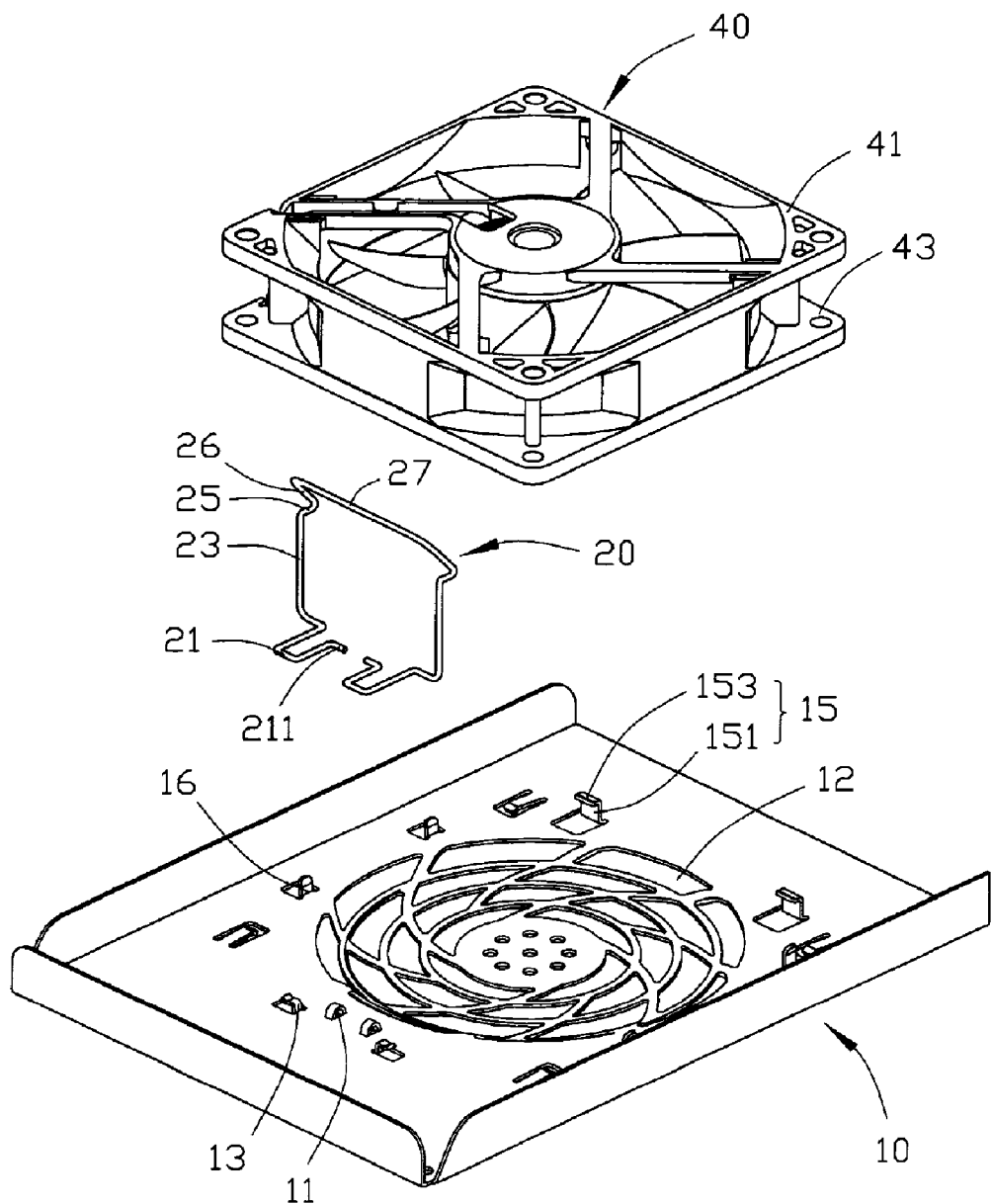
FIG. 1 is an exploded, isometric view of a mounting apparatus of the present invention, and a fan.

Referring to FIG. 1, a mounting apparatus of an electronic device like a computer in accordance with a preferred embodiment of the present invention is used to secure a fan 40. The mounting apparatus includes a panel 10 of a computer enclosure for attaching the fan 40 thereon, and a mounting bracket 20.

The panel 10 defines a plurality of vents thereof to form a generally circular ventilation area 12 for air ventilation between an inside and an outside of the computer enclosure. A pair of clips 15, used as a first means of the mounting apparatus, is formed at a front side of the ventilation area 12. Each clip 15 includes a blocking portion 151 and a clipping portion 153 perpendicular to the blocking portion 151. At a rear side of the ventilation area 12, the panel 10 forms a pair of bent pieces 13, and defines a pair of receiving holes 11 between the bent pieces 13. A row of restricting pieces 16, used as another type of the first means of the mounting apparatus, is formed at each of the other two sides of the ventilation area 12 respectively.

An elastic wire is bent to form the mounting bracket 20. The mounting bracket 20, used as a second means of the mounting apparatus, includes a pair of "n"-shaped bases 21 at a bottom thereof. Each base 21 has a free end 211 opposite to the other base 21. Another end of each base 21 extends upwardly and vertically to form a shank 23. A top distal end of each shank 23 is bent forward to form a horizontal pressing portion 25. A free end of each pressing portion 25 is extended upwardly and slantingly to form a supporting portion 26. The two supporting portions 26 are interconnected by a connecting portion 27.

The fan 40 includes a top panel 41 and a bottom panel 43. A thickness of the bottom panel 43 is slightly greater than a height of the blocking portion 151 of the clip 15.

Figure 2:
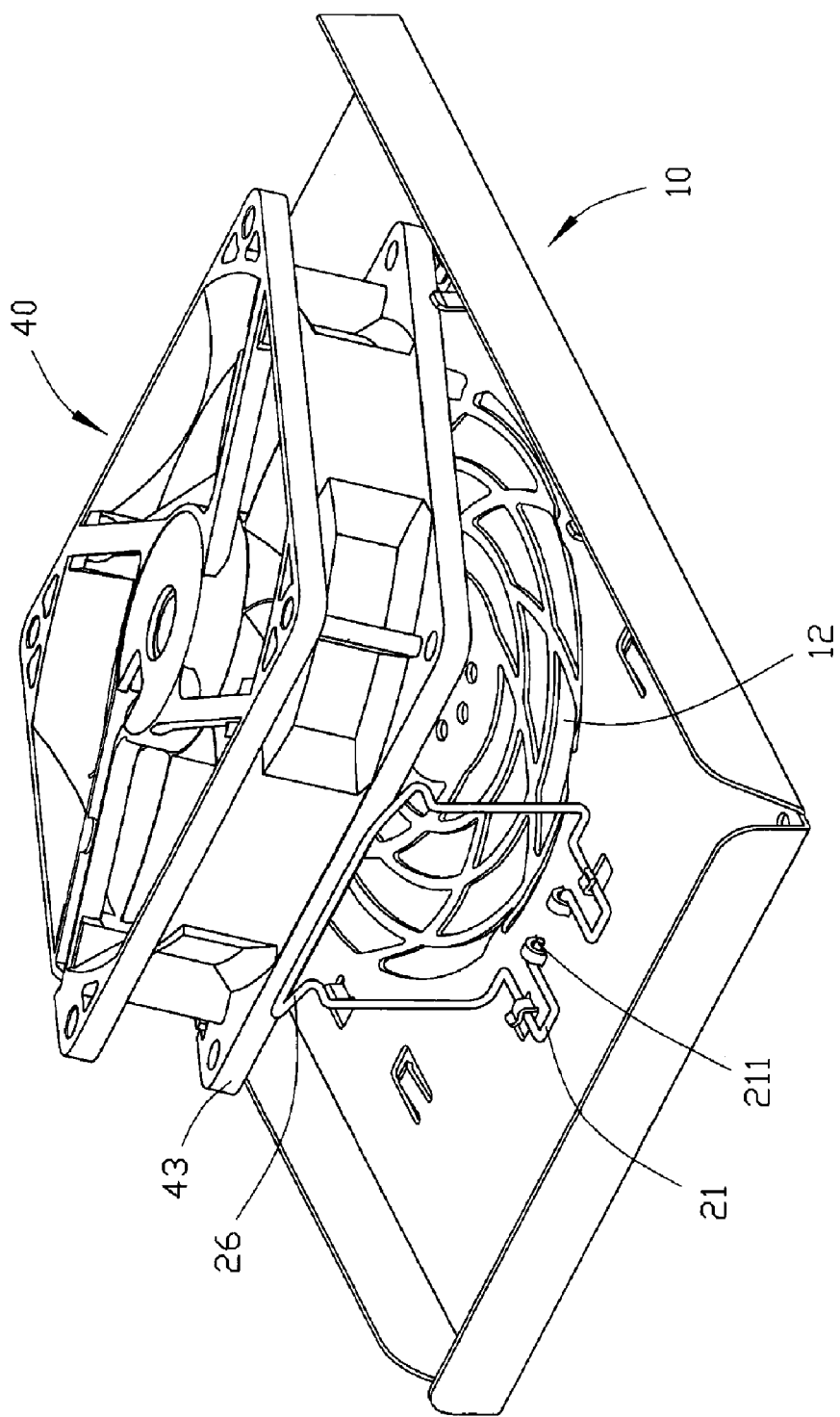
FIG. 2 is an isometric view of the fan pre-mounted using the mounting apparatus of FIG. 1.
Figure 3:
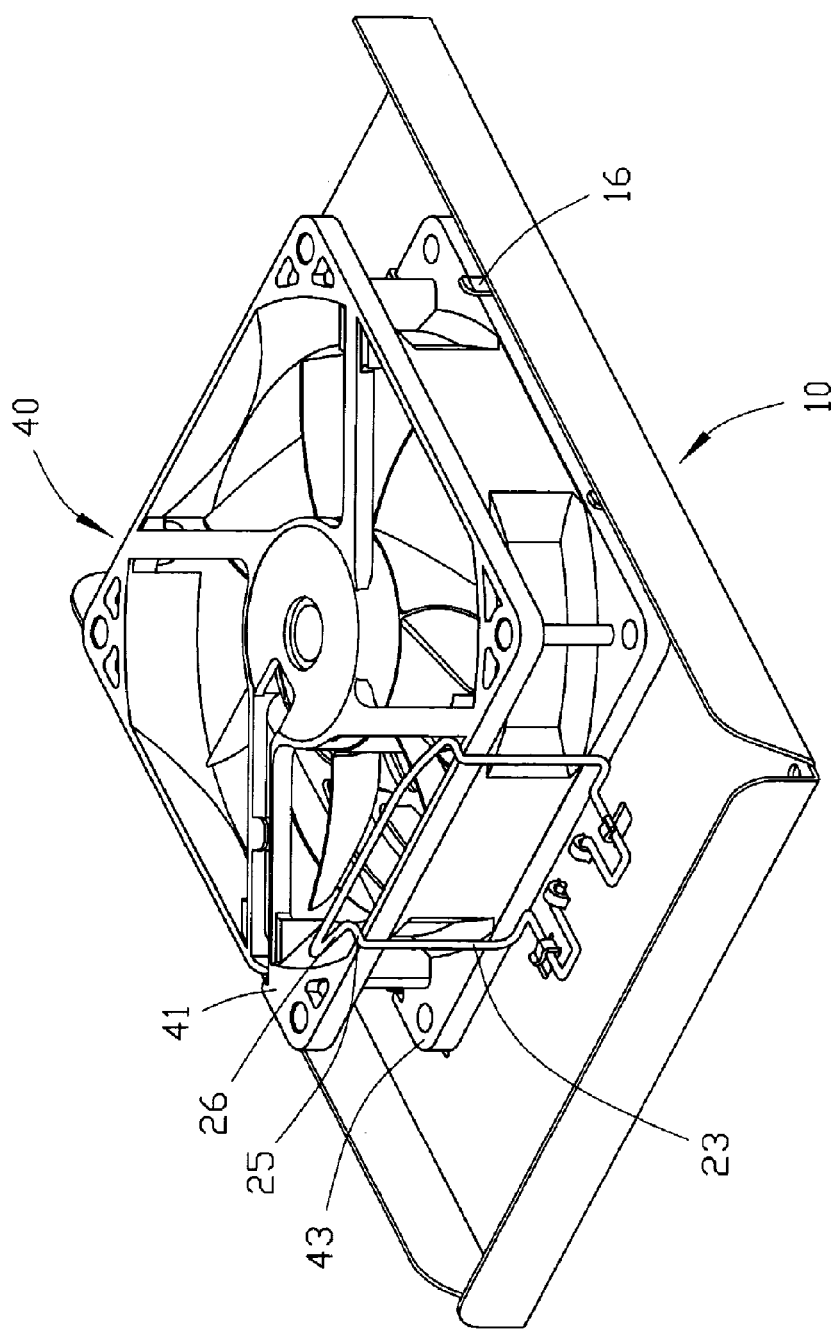
FIG. 3 is an isometric view of the fan mounted using the mounting apparatus of FIG. 1.
Figure 4:
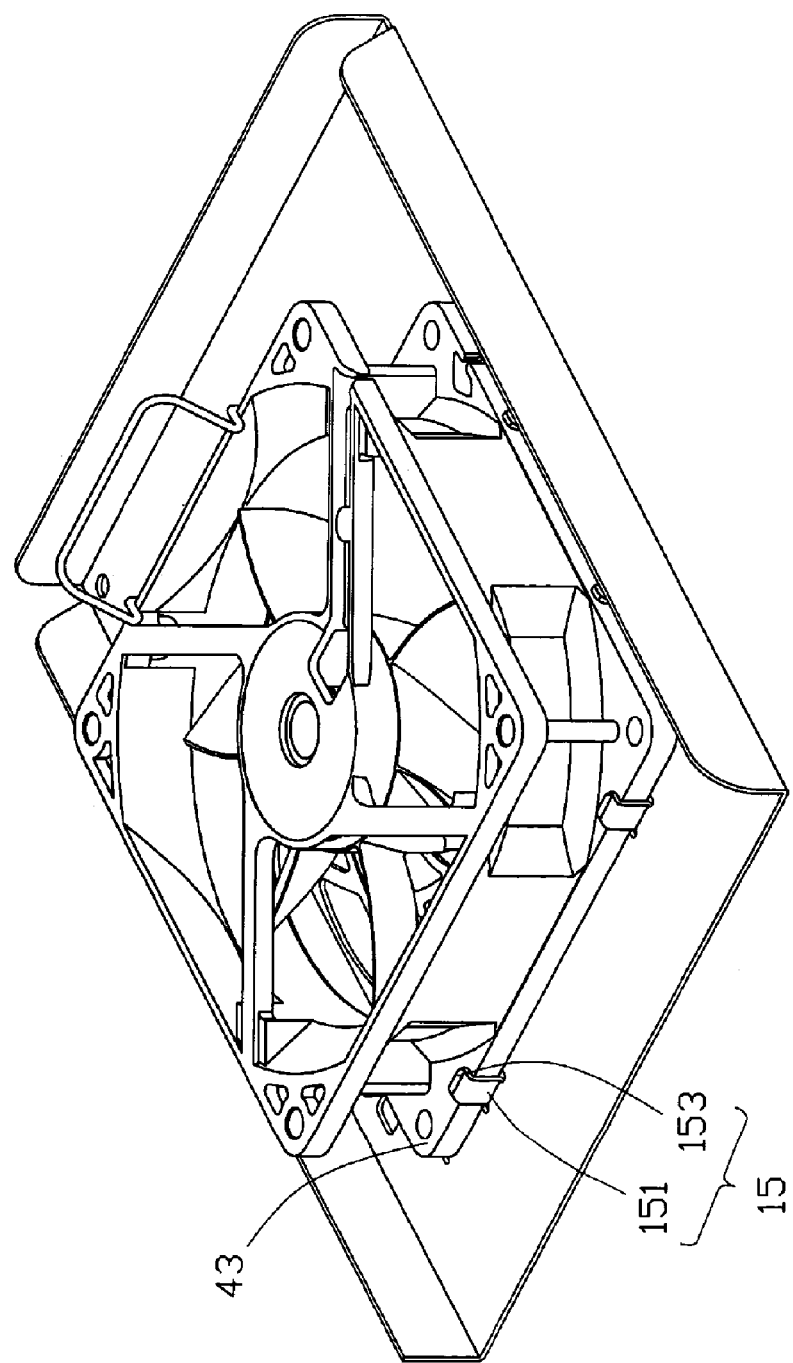
FIG. 4 is similar to FIG. 3, but viewed from another aspect.

Referring to FIGS. 2, 3, and 4, the free end 211 of one base 21 of the pair of bases 21 is inserted into one receiving hole 11, and one side of the base 21 is clipped by the corresponding bent piece 13 to the panel 10. Then, the mounting bracket 20 is elastically deflected to have the other base 21 secured on the panel 10. So the mounting bracket 20 is mounted on the panel 10 via the pair of bases 21.

In assembly of the fan 40 to the panel 10, the fan 40 is inclined with a rear side of the fan 40 lifted up to be laid on the supporting portions 26 of the mounting bracket 20 and a front side of the fan 40 placed on the panel 10. A front end of the bottom panel 43 is abutted against the clips 15. The other two sides of the fan 40 are aligned between the two rows of restricting pieces 16.

The rear side of the fan 40 that is laid on the supporting portion 26 is pressed to deflect the shanks 23 back. The rear side of the fan 40 is slid down from the supporting portions 26 and abuts on the panel 10. Then, the shanks 23 elastically rebound causing the pressing portions 25 to press on the top of the fan 40 and the shanks 23 to block the rear side of the fan 40. Simultaneously, the front end of the bottom panel 43 is intruded into the clips 15. The blocking portions 151 of the clips 15 block the front side of the fan 40, and the clipping portions 153 of the clips 15 clip to a top surface of the bottom panel 43. The two rows of pieces 16 restrict two sides of the fan 40. The fan 40 is thus secured on the panel 10.

In disassembly, the mounting bracket 20 is pulled backward to have the pressing portions 25 move away from the top of the fan 40. Then, the fan 40 can be disassembled from the panel 10.

In the above-mentioned embodiment, the restricting members (such as clip 15, restricting piece 16, mounting bracket 20, and so on) can be replaced by the mounting brackets 20. For example, the two clips 15 can be replaced by a mounting bracket 20, so that each of a pair of opposite sides of the fan 40 are restricted by the mounting brackets 20. Further, four mounting brackets 20 can be mounted on four sides of the ventilation area 12 to restrict four sides of the fan 40.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a fan in a computer, comprising:
    a panel of the computer configured to mount the fan thereon, the panel defining a ventilation area corresponding to the fan for air ventilation between opposite sides of the panel; and
    a plurality of restricting members set around the ventilation area of the panel for restricting the movement of the fan along the panel, the restricting members comprising at least one mounting bracket, the mounting bracket comprising an elastic shank extending upwardly from the panel and a pressing portion protruding from the shank, the pressing portion clamping the fan against the panel;
    wherein the mounting bracket comprises bases secured on the panel, one end of each base is extended upwardly to form the shank, the shank is bent horizontally to form the pressing portion, the pressing portion extends upwardly and slantingly to form a supporting portion configured to guide the fan clamped by the mounting bracket;
    wherein the bases are "n"-shaped.

2. The mounting apparatus as described in claim 1, wherein each of the bases comprises a free end, and the panel defines a pair of receiving holes configured to receive the free ends therein.

3. The mounting apparatus as described in claim 2, wherein the panel forms a pair of bent pieces configured to clip the bases.

4. The mounting apparatus as described in claim 1, wherein the restricting members further comprise a fixed clip opposite to the mounting bracket.

5. The mounting apparatus as described in claim 4, wherein the clip comprises a blocking portion configured to block one side of the fan and a clipping portion configured to clamp the fan against the panel.

6. The mounting apparatus as described in claim 1, wherein the restricting members comprise a plurality of restricting pieces.

7. A mounting apparatus for mounting a fan in a computer, comprising:
    a panel of the computer configured to mount the fan thereon, the panel defining a ventilation area corresponding to the fan for air ventilation between opposite sides of the panel; and
    a plurality of restricting members set around the ventilation area of the panel for restricting the movement of the fan along the panel, the restricting members comprising at least one mounting bracket, the mounting bracket comprising an elastic shank extending upwardly from the panel and a pressing portion protruding from the shank, the pressing portion clamping the fan against the panel;
    wherein the mounting bracket comprises bases secured on the panel, one end of each base is extended upwardly to form the shank, the shank is bent horizontally to form the pressing portion, the pressing portion extends upwardly and slantingly to form a supporting portion configured to guide the fan clamped by the mounting bracket;
    wherein the restricting members further comprise a fixed clip opposite to the mounting bracket; and
    wherein the clip comprises a blocking portion configured to block one side of the fan and a clipping portion configured to clamp the fan against the panel.

8. A mounting apparatus for mounting a fan in a computer, comprising:
    a panel of the computer configured to secure the fan thereon;
    a deflectable mounting bracket which is bent from an elastic wire, the mounting bracket set on the panel and comprising a pressing portion clamping one side of the fan against the panel; and
    a fixed clip set on the panel to clamp an opposite side of the fan against the panel to secure the fan on the panel;
    wherein the mounting bracket comprises an elastic shank configured to block a side of the fan, the shank is bent horizontally to form the pressing portion, the pressing portion extends upwardly and slantingly to form a supporting portion configured to guide the fan clamped by the mounting bracket;
    wherein the panel defines a ventilation area where the fan is secured thereon, the mounting bracket is set on one side of the ventilation area, and the clip is set on opposite side of the ventilation area, the clip comprises a blocking portion configured to block a side of the fan and a clipping portion configured to clamp the fan against the panel.

9. The mounting apparatus as described in claim 8, wherein a plurality of restricting pieces are formed at the other two sides of the ventilation area.

* * * * *